United States Patent
Hahn et al.

(10) Patent No.: US 6,778,650 B1
(45) Date of Patent: Aug. 17, 2004

(54) CIRCUIT BREAKER REMOTE SERVICE SYSTEM

(75) Inventors: Michael Hahn, Berlin (DE); Jeffery C. Mizener, Sidney, OH (US)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/181,734

(22) PCT Filed: May 16, 2000

(86) PCT No.: PCT/DE00/01581
§ 371 (c)(1),
(2), (4) Date: Jul. 22, 2002

(87) PCT Pub. No.: WO01/89052
PCT Pub. Date: Nov. 22, 2001

(51) Int. Cl.[7] ............................................. H04M 11/00
(52) U.S. Cl. ................................................ 379/106.01
(58) Field of Search ................ 379/106.01, 106.03, 379/106.04, 106.05, 106.06, 106.07, 106.09, 106.11, 21, 27.07, 28; 324/424

(56) References Cited

U.S. PATENT DOCUMENTS

| | | | |
|---|---|---|---|
| 4,837,811 A | * 6/1989 | Butler et al. | 379/96 |
| 5,270,658 A | * 12/1993 | Epstein | 340/638 |
| 5,533,093 A | * 7/1996 | Horton et al. | 379/21 |
| 5,596,473 A | 1/1997 | Johnson et al. | |
| 5,682,422 A | * 10/1997 | Oliver | 379/106.03 |
| 6,539,384 B1 | * 3/2003 | Zellner et al. | 707/10 |

FOREIGN PATENT DOCUMENTS

| | | |
|---|---|---|
| EP | 0444622 | 2/1991 |
| EP | 0935327 | 2/1998 |
| WO | 89/12345 | 6/1989 |

* cited by examiner

Primary Examiner—Stella Woo
(74) Attorney, Agent, or Firm—Harness, Dickey & Pierce, P.L.C.

(57) ABSTRACT

A remote service system for a circuit breaker fixed in a remote allocation. Remote service is provided by any station that can be accessed through a communication network. The system is provided, on one side, with a diagnostic hand-held apparatus which is dedicated to a switch service and should be connected, if necessary, to a circuit breaker, through a connecting unit provided to that end, and on the other side, with a telecommunication interface for exchanging a data through a telecommunication network.

30 Claims, 1 Drawing Sheet

CIRCUIT BREAKER REMOTE SERVICE SYSTEM

This application is the national phase under 35 U.S.C. §371 of PCT International Application No. PCT/DE00/01581 which has an International filing date of May 16, 2000, which designated the United States of America, the entire contents of which are hereby incorporated by reference.

FIELD OF THE INVENTION

The invention generally relates to a system for remote servicing of circuit breakers. Preferably, it relates to one for the transmission of up-to-date information about the state of a switch which is installed at a remote location to any desired service center which can be accessed via a telecommunications network or by radio, using a diagnosis handset which can be connected to the circuit breaker when required.

BACKGROUND OF THE INVENTION

Systems already exist for remote control of circuit breakers, and in principle these also allow remote diagnosis. A system such as this is described in WO 98/123455 A1. In an expanded system according to U.S. Pat. No. 5,596,473, the circuit breakers in a switchgear assembly are connected all the time to a control center, from which the switching commands are transmitted. If a diagnosis handset is connected to a circuit breaker in order to carry out test routines, then the connection to the control center is broken. The test can thus be carried out only on site, and the control center is excluded from this. There is also only one connection to a specific control center, and it is impossible to transmit the data relating to the circuit breaker or the test set to any other point.

SUMMARY OF THE INVENTION

An object of an embodiment of the present invention is to provide a system for remote servicing of circuit breakers. Preferably, the system able to transmit up-to-date information about the state of a circuit breaker which is installed at a remote location to any desired point, for example to a point which can be accessed via a telephone network or via radio, with little effort by personnel.

An object may be achieved according to an embodiment of the invention in that the diagnosis handset, which is equipped with a plug-in unit for connection to the circuit breaker on one side, can be equipped on the other side with a communications interface. This allows data to be interchanged with the service center via the telecommunications network. Further, the circuit breaker may include a plug socket to which the diagnosis handset can be connected via its plug-in unit.

Thus, remote diagnosis can be carried out when required, and data can be transmitted between the circuit breaker and the service center only for this purpose.

A diagnosis handset can thus be provided which is connected to the circuit breaker via the plug connection provided for this purpose, and on the other hand can be connected, by way of example, to a telephone network via a telephone plug-in device (telecommunications access unit=TAE), which is likewise arranged on the diagnosis handset for this purpose, that is to say, by way of example, via a TAE socket.

The interface to the telecommunications network may, of course, also be a Western modular plug-in device, a plug-in unit as is used for the networking of computers in buildings, etc.

Expediently, either a device which sets up a data connection to the calling service center, in response to a telephone call, or a dialing device which sets up a data connection to a service center either on command by the user or automatically, may be integrated in the handset.

This makes it possible for a customer to carry out a test at any time by setting up a connection to the circuit breaker in the intended manner.

Since appropriate programming is possible, this can be achieved by operating only one button, and the service center receives a message, for example "switch 40772 has signal, please check everything" on the monitoring screen.

Another possible scenario is one in which, because the service center has the task of checking the switch periodically, it requests that the test set be connected, and then carries out the check remotely. In this way, the competence of the manufacturer of the circuit breaker can be made use of in a short time, virtually anywhere in the world.

BRIEF DESCRIPTION OF THE DRAWINGS

The invention will be explained in more detail in the following text using a preferred exemplary embodiment and with reference to the attached drawing.

The single FIGURE shows, schematically, the system which is formed from a circuit breaker, a diagnosis handset and a telecommunications unit.

DETAILED DESCRIPTION OF THE PREFERRED EMBODIMENTS

Figure 1:
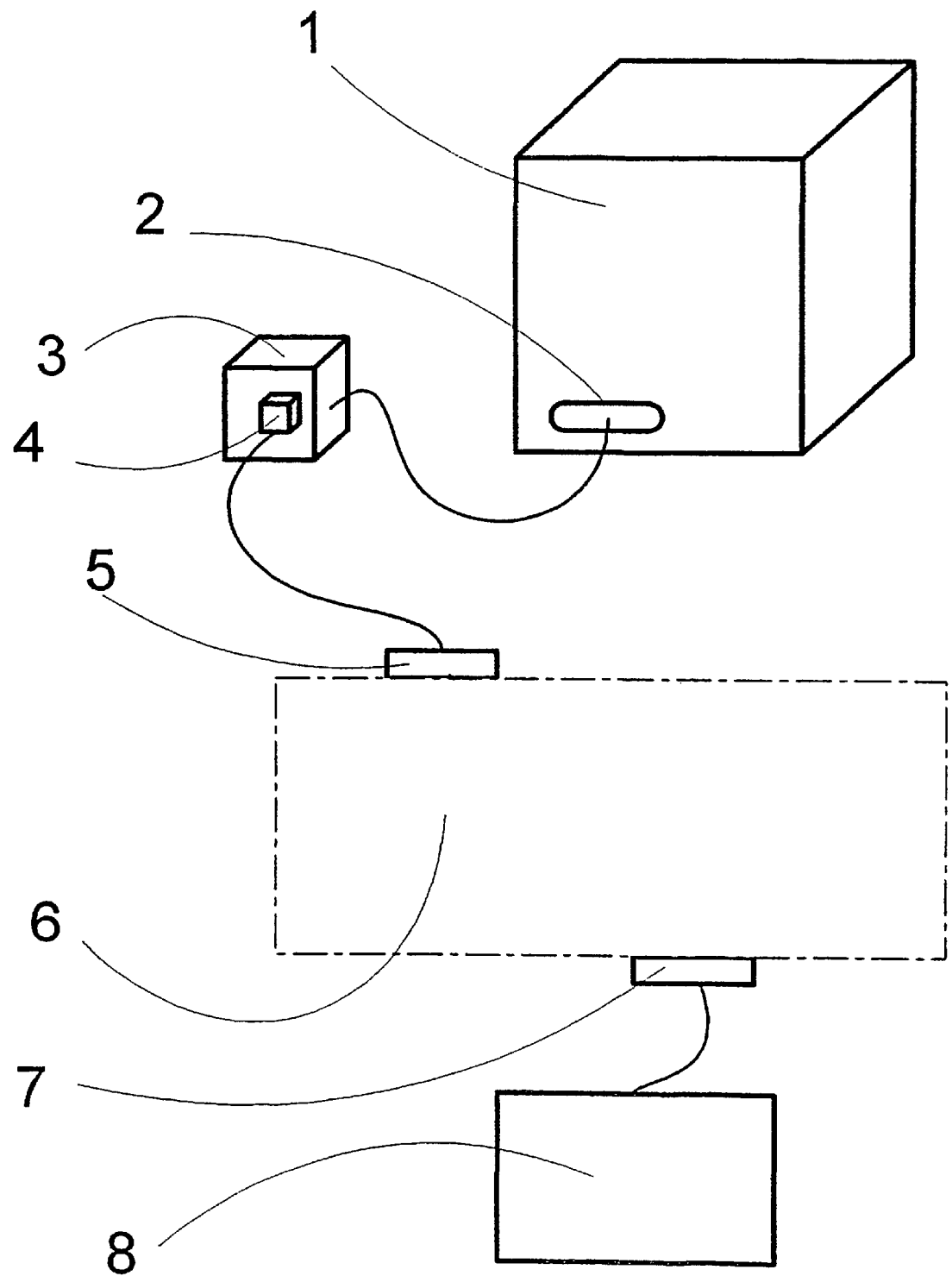

The FIGURE shows, schematically, a circuit breaker 1, which is provided with a diagnosis socket 2. A diagnosis handset 3 is connected to the diagnosis socket 2, and has a modem 4 via which the diagnosis handset 3 is connected to a telephone network 6 via a telecommunications unit 5, on the side facing away from the switch connection. The service center 8 is connected via a further telecommunications unit 7 at the opposite end of the telephone network 6. The transmission may, of course, also be made using other telecommunications facilities, such as by radio or via the Internet.

The system according to an embodiment of the invention for remote servicing for circuit breakers allows a customer to carry out a test, and to set up a connection to the circuit breaker, at any time. It also allows service centers which have the task of checking the switch periodically, of doing this remotely.

In this way, the competence of the manufacturer of the circuit breaker may be used in a short time virtually anywhere in the world, and not only from a control center. This may all be done with little personnel effort.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A system for remote servicing of a circuit breaker, comprising:

a diagnosis handset, connectable to the circuit breaker, wherein the diagnosis handset includes on one side, a plug-in unit for connection to the circuit breaker, and includes on another side, a communications interface which allows data to be interchanged with a plurality of service centers, without interrupting commands from a control center, and wherein the circuit breaker includes a plug socket to which the diagnosis handset is connectable via its plug-in unit.

2. The system as claimed in claim 1, wherein the communications interface comprises a telecommunications unit.

3. The system as claimed in claim 2, wherein the telecommunications unit includes a TAE socket and a TAE plug.

4. The system as claimed in claim 2, wherein a device, which in response to a telephone call, sets up a data connection to one or more of the service centers, is integrated in the diagnosis handset.

5. The system as claimed in claim 2, wherein a dialing device which, on command by a user, produces a data connection to one or more of the service centers, is integrated in the diagnosis handset.

6. The system as claimed in claim 2, wherein a dialing device, which automatically produces a data connection to one or more of the service centers, is integrated in the diagnosis handset.

7. The system as claimed in claim 1, wherein the communications interface comprises a Western modular connection unit.

8. The system as claimed in claim 7, wherein a device, which in response to a telephone call, sets up a data connection to one or more of the service centers, is integrated in the diagnosis handset.

9. The system as claimed in claim 7, wherein a dialing device which, on command by a user, produces a data connection to one or more of the service centers, is integrated in the diagnosis handset.

10. The system as claimed in claim 7, wherein a dialing device, which automatically produces a data connection to one or more of the service centers, is integrated in the diagnosis handset.

11. The system as claimed in claim 1, wherein the communications interface comprises a plug-in unit, as is used for networking of computers in buildings.

12. The system as claimed in claim 11, wherein a device, which in response to a telephone call, sets up a data connection to one or more of the service centers, is integrated in the diagnosis handset.

13. The system as claimed in claim 11, wherein a dialing device which, on command by a user, produces a data connection to one or more of the service centers, is integrated in the diagnosis handset.

14. The system as claimed in claim 11, wherein a dialing device, which automatically produces a data connection to one or more of the service centers, is integrated in the diagnosis handset.

15. The system as claimed in claim 1, wherein a device, which in response to a telephone call, sets up a data connection to one or more of the service centers, is integrated in the diagnosis handset.

16. The system as claimed in claim 1, wherein a dialing device which, on command by a user, produces a data connection to one or more of the service centers, is integrated in the diagnosis handset.

17. The system as claimed in claim 1, wherein a dialing device, which automatically produces a data connection to one or more of the service centers, is integrated in the diagnosis handset.

18. The system as claimed in claim 1, wherein the system is for the transmission of up-to-date information about the state of a circuit breaker, installed at a remote location, to one or more of the service centers, wherein the transmission occurs by at least one of a telecommunications network and by radio.

19. A diagnosis handset, connectable to a circuit breaker, for use in a system for remote servicing of the circuit breaker, comprising:

a plug-in unit, on one side of the diagnosis handset, for connection to the circuit breaker; and a communications interface, on another side of the diagnosis handset, which allows data to be interchanged with a plurality of service centers without interrupting commands from a control center, wherein the circuit breaker includes a plug socket to which the diagnosis handset is connectable via its plug-in unit.

20. The diagnosis handset as claimed in claim 19, wherein a device, which in response to a telephone call, sets up a data connection to one or more of the service centers, is integrated in the diagnosis handset.

21. The diagnosis handset as claimed in claim 19, wherein a dialing device which, on command by a user, produces a data connection to one or more of the service centers, is integrated in the diagnosis handset.

22. The diagnosis handset as claimed in claim 19, wherein a dialing device, which automatically produces a data connection to one or more of the service centers, is integrated in the diagnosis handset.

23. A system for remote servicing of a circuit breaker, comprising:

a diagnosis handset, connectable to the circuit breaker, wherein the diagnosis handset includes on one side, connection means for connecting the handset to the circuit breaker, and includes on another side, communications interface means for allowing data to be interchanged with a plurality of service centers without interrupting commands from a control center, and wherein the circuit breaker includes a plug socket to which the diagnosis handset is connectable via the connection means.

24. The system as in claim 23 further comprising:

means, integrated in the handset and responsive to a telephone call, for setting up a data connection to one or more of the service centers.

25. The system as in claim 23 further comprising:

means, integrated in the handset and responsive to a command by a user, for producing a data connection to one or more of the service centers.

26. The system as in claim 23 further comprising:

means, integrated in the handset, for automatically producing a data connection to one or more of the service centers.

27. A diagnosis handset, connectable to a circuit breaker, for use in a system for remote servicing of the circuit breaker, comprising:

connection means, on one side of the diagnosis handset, for connecting the handset to the circuit breaker; and communications interface means, on another side of the diagnosis handset, for allowing data to be interchanged with a plurality of service centers without interrupting commands from a control center, wherein the circuit breaker includes a plug socket to which the diagnosis handset is connectable via the connection means.

28. The diagnosis handset as claimed in claim 27 further comprising:

means, integrated in the handset and responsive to a telephone call, for setting up a data connection to one or more of the service centers.

29. The diagnosis handset as claimed in claim 27, further comprising:

means, integrated in the diagnosis handset and responsive to a command by a user, for producing a data connection to the one or more service centers.

30. The diagnosis handset as claimed in claim 27, further comprising:

means, integrated into the diagnosis handset, for automatically producing a data connection to the one or more service centers.

* * * * *